United States Patent [19]
Deyst, Jr. et al.

[11] Patent Number: 6,018,812
[45] Date of Patent: *Jan. 25, 2000

[54] RELIABLE WAFER-SCALE INTEGRATED COMPUTING SYSTEMS

[75] Inventors: John J. Deyst, Jr., Arlington; Richard E. Harper, Needham; Jaynarayan H. Lala, Wellesley, all of Mass.

[73] Assignee: 501 Charles Stark Draper Laboratory, Inc., Cambridge, Mass.

[*] Notice: This patent is subject to a terminal disclaimer.

[21] Appl. No.: 07/600,204

[22] Filed: Oct. 17, 1990

[51] Int. Cl.[7] ................................................... H04B 17/00
[52] U.S. Cl. ............................................. 714/724; 714/43
[58] Field of Search .................................. 371/22.1, 10.2, 371/21.2, 67.1; 714/724, 710, 719, 819, 43

[56] References Cited

U.S. PATENT DOCUMENTS

| | | | |
|---|---|---|---|
| 4,907,232 | 3/1990 | Harper et al. | 371/36 |
| 4,937,741 | 6/1990 | Harper et al. | 371/61 |
| 4,970,724 | 11/1990 | Yung | 371/22.1 |
| 5,042,038 | 8/1991 | Protor et al. | 371/8.2 |
| 5,144,627 | 9/1992 | Horie et al. | 371/22.1 |

*Primary Examiner*—Phung M. Chung
*Attorney, Agent, or Firm*—Robert F. O'Connell; Henry D. Pahl, Jr.; Peter J. Manus

[57] ABSTRACT

Wafer scale integrated circuitry which uses a cluster of wafer components, each component having a plurality of processing elements and a network element connected thereto for controlling the transfer of information to and from the processing elements. The network element is connected to network elements of other wafer components of the cluster for controlling the transfer of information to and from such other network elements. One or more redundant groups of processing elements are formed on the wafer components of the cluster, each redundant group being configured so that the processing elements in the group reside on different ones of the wafer components.

9 Claims, 5 Drawing Sheets

RELIABLE WAFER-SCALE INTEGRATED COMPUTING SYSTEMS

INTRODUCTION

This invention relates generally to techniques for producing wafer-scale integrated circuitry and, more particularly, to a novel technique for configuring wafer-scale integrated circuitry so as to increase the testability, the yield and the reliability thereof.

BACKGROUND OF THE INVENTION

In general, wafer-scale integrated circuitry has been fabricated in a manner such that electronic elements or circuits are fabricated on a wafer and testing is provided by using external means, such as external testing circuits using suitable probes to connect to the wafer-scale elements or circuits to be tested. Such external testing means are used to determine which elements, or which circuits, or parts thereof, on a wafer are operable and which are not. Such technique is specially devised so as to address specific elements or circuits at different regions of the wafer using what is generally referred to as test vectors. As the complexity and density of circuits and elements on a wafer increase, the effectiveness of such a vector testing approach decreases, especially for regions which are imbedded relatively deeply within the wafer. Moreover, as complexity of the circuitry and elements placed on a wafer increases, a point is reached where the likelihood of being able to manufacture a wafer with all of its elements working correctly is extremely low so that the manufacturing process has a very low yield.

More recently, it has been proposed to use on-wafer redundancy techniques wherein redundant elements, or redundant circuits, or parts thereof, are placed on the wafer so as to improve both the testability and the yields thereof. Such redundancy was believed to be especially promising for use in creating relatively homogeneous and regular structures, such as memories, where additional rows and columns of bits can be placed on a wafer both to test its function and to replace faulty regions. It was proposed, for example, to replace defective rows and columns of bits with redundant counterparts on the same wafer, by using techniques, such as fusing appropriate intercomponent links using a laser.

However, it is found that using an active process, such as fusing links with a laser, can itself induce further defects in the elements or circuits of a wafer and requires still further testing and possible further reconfiguration after the initial reconfiguration phase of the production process has been completed. Moreover, the process is time consuming and must be customized for each wafer, so that it is extremely difficult to implement such technique on a mass production basis. The yields thereof are relatively low, while the cost is relatively high. Moreover, when using irregular circuits, such as processors or other randomly shaped or placed logic elements, it is very difficult to devise comprehensive on-wafer test circuits. The test circuits themselves tend to become so complex that their correct functioning may not be assured and they must also be checked. Since all circuits on a wafer are generally in close physical proximity to each other, they tend to share common mode failures, i.e., faults which affect several redundant components at the same time, which faults can defeat the use of redundant circuits or elements on the wafer. Such fault tolerant techniques for on-wafer redundancy, as well as for vector testing techniques, have generally been relatively unwieldly, complex and ineffective.

BRIEF SUMMARY OF THE INVENTION

In accordance with the invention, a wafer fabrication and operation process utilizes redundancy principles, but in a manner different from the on-wafer redundancy approach previously proposed. In the on-wafer redundancy approach, a plurality of redundant elements are used on the same wafer, which comprises but a single fault containment region, so that certain faults cause the entire region and, accordingly, all of the redundant elements to become useless.

In contrast, rather than placing redundant elements on the same wafer, a system in accordance with the invention places redundant elements on a plurality of different wafers formed as a cluster of such wafers. Redundant groups of elements are so formed in which each element of a group is on a different wafer. Thus, none of the elements or circuits on any particular wafer are contained in the same redundant group and, by suitable electrical and physical isolation, they have independent (i.e., non-correlated) failure modes. In such a manner, the elements in any redundant group are essentially isolated from each other.

The approach of the invention represents a novel and effective adaptation for wafer-scale circuit fabrication of principles utilized for multiple processor operation, such as described, for example, in copending application Ser. No. 07/187,474 filed on Apr. 28, 1988 by R. Harper and J. Lala, entitled "Fault Tolerant Parallel Processing System", incorporated by reference herein.

In the wafer-scale context, a plurality of wafers, essentially working together as a cluster thereof, can be used so as to detect and identify faults in one or more elements or circuits of each wafer and to reconfigure an overall operating system electronically in order to isolate such faults. No active means, such as the use of laser fusion techniques to provide links between elements, are required to reconfigure the elements to form an operating system. Thus, arbitrary wafer faults can be tolerated with very high probability, with the result that only a relatively small section of each wafer may be required to be non-faulty in order for the system itself to function.

In accordance with such approach, once redundant circuitry has been formed on a plurality of wafers, initialization routines for the system include a set of distributed test routines which allow the components and data paths on each wafer to be tested for operability, the wafer being effectively operable so long as there are no more than a pre-specified. number of component or data path faults. The initialization process detects and identifies fabrication faults in components or data paths on a wafer and appropriately electronically isolates them, making use of spare elements on the wafer to replace the faulty elements. Such process also occurs during the operational lifetime of the system so as to isolate run-time faults.

DESCRIPTION OF THE DRAWINGS

The invention can be described in more detail with the help of the accompanying drawings wherein.

DESCRIPTION OF A PREFERRED EMBODIMENT

Figure 1:
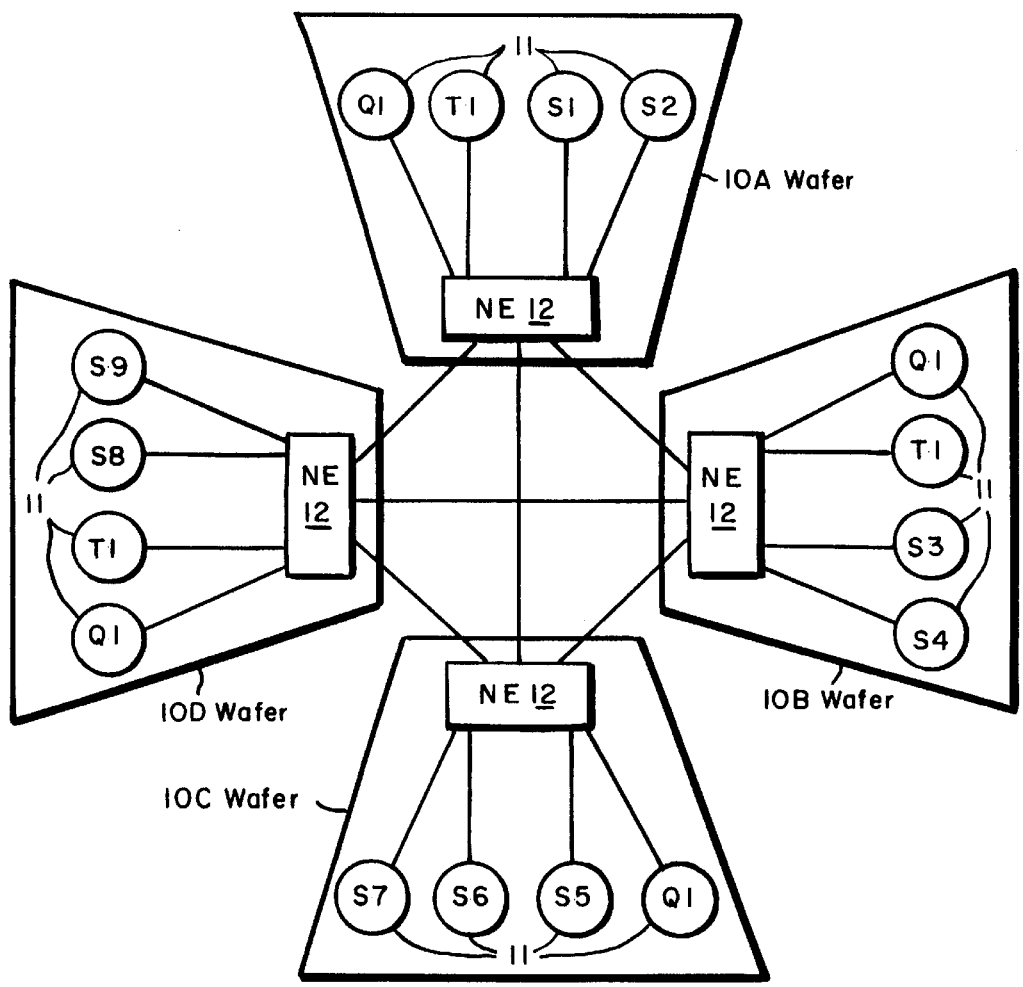
FIG. 1 shows a diagrammatic view of an exemplary embodiment of redundant circuitry placed on a plurality of wafers in accordance with the invention.
Figure 1A:
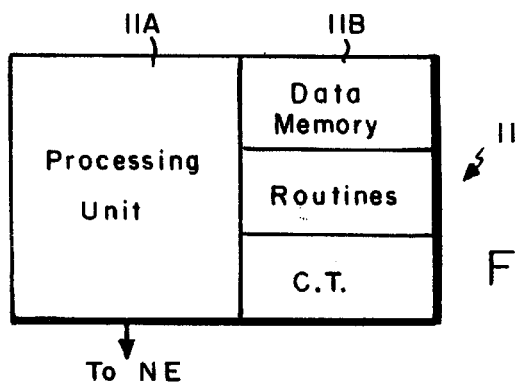
FIG. 1A shows a diagrammatic view of an exemplary processing element of FIG. 1.

As can be seen in the general configuration of FIG. 1, each of a plurality of fault containment regions (FCRs) 10A–10D is formed on a separate wafer and includes a plurality of processor elements (PEs) 11 formed therein, which processor elements are connected to one or more network elements (NEs) 12 thereof. Each processor element includes a processing unit 11A and a memory unit 11B which memory can store various data, program routines, e.g., testing routines, and a configuration table (CT) discussed in more detail below, as shown by an exemplary processor element 11 in FIG. 1A. More specifically, in the particular example of FIG. 1, four FCRs or wafers are shown which work together as a cluster thereof (although it should be noted that more than four FCRs can be used), each FCR having, in the particular embodiment depicted, four processor elements and a network element, the wafers being physically and electrically independent of each other to prevent physical faults in any one wafer from propagating beyond the particular wafer involved. Although four processor elements are shown in the exemplary FCRs depicted, it should be realized that an arbitrary number, greater or fewer than four, can be present in each FCR. Processor elements on different wafers can be organized into redundant groups thereof or can operate as a single non-redundant processing element. As an example shown in FIG. 1, the four processors identified as Q1 are formed separately on each of the four wafers 10A–10D to provide a quadruplex redundant group. The processors identified as T1 on wafers 10A, 10B and 10D form a triplex redundant group. The processors identified by S (S1, S2, . . . S9) operate independently and are non-redundant simplex processing elements.

As set forth in accordance with the invention, each fault containment region is a separate wafer, or a set of wafers, of a cluster thereof and processors contained on the same wafer (i.e. in the same FCR) cannot be members of the same redundant processor group. Put another way, all processor members of a redundant group thereof must be on a different wafer. Such configuration assures that a single fault in one processor of a redundant group disables no more than that one processor in that group, all other processors in the group remaining operable. Redundant processors of a group which are contained in different wafers communicate with each other via network elements 12 while processors of one redundant group can also communicate with processors of another redundant group via NEs 12. While a number of communication links are required for such communication, the number required is much smaller than the number which would be required to interconnect all of the processors in the system directly to each other.

Figure 2:
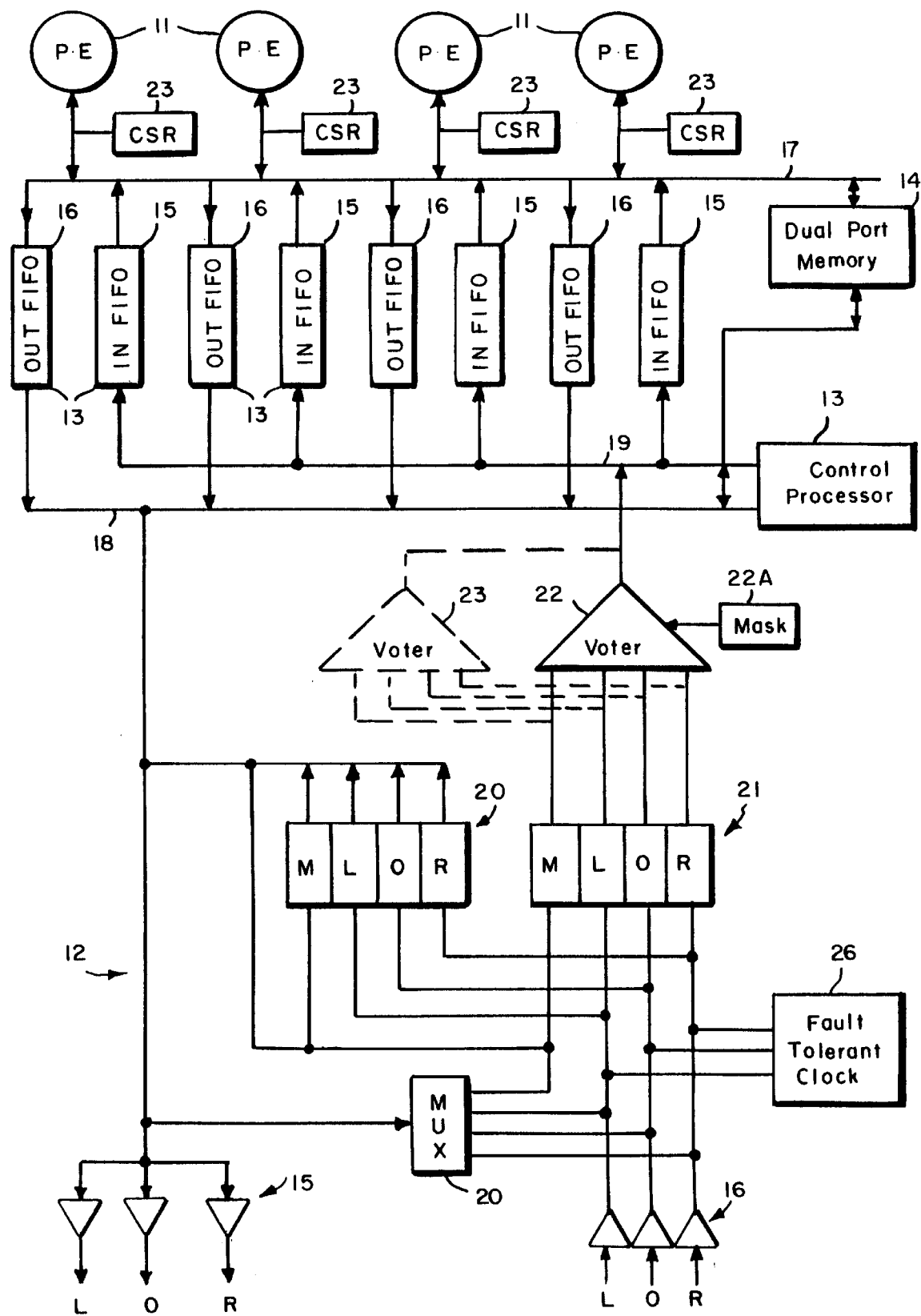
FIG. 2 shows a more detailed block diagram of a network element and processing elements associated therewith.

While an FCR (wafer) needs only one functioning network element to be completely operational, more than one NE can be fabricated on a single wafer for yield and fault tolerance reasons. Because an NE is composed primarily of memories and programmable logic arrays, an NE has a highly regular structure and is amenable to the addition of redundant rows, columns, and other logic blocks on the wafer. A more specific showing of a network element and processors associated therewith is shown in FIG. 2. The use of four processors 11 on each wafer is exemplary only and fewer or more than four processors may be connected to the network element of a wafer for yield and fault tolerance reasons. A set of algorithms in accordance with the invention can be used to configure sets of processors and network elements from different wafers, into operational redundant groups and to reject and isolate those components in each group which are found to be non-functional (faulty). Before such redundant groups can be configured, suitable testing routines are used to test the individual components, i.e., the processors and the components of the network elements on each particular wafer, as well as the interconnections (data paths) among them, to determine which are functional and which are not functional. Thus, the processors can perform self-testing routines which require no additional hardware overhead other than the processor's memories in which the self-test codes of the routines are stored for use by the processor. Processors failing the self-test routine can be identified and arranged so that they can no longer participate in system operation.

In addition, once an operational processor is found on each wafer, it can be used to implement network element testing procedures or routines to perform data path and component testing of each of the network elements to which it is connected. If a faulty network element is detected either that wafer is discarded, if that is the only network element on the wafer, or a redundant network element or component thereof on that wafer is activated and also tested.

If the processors and network elements on a wafer have been successfully tested using self test routines, so that at least one processor and at least one network element makes the wafer functional, the operations of the wafer under test are then appropriately synchronized with the operations of other wafers which have previously been fully tested, synchronized, and operated as a redundant group. Synchronization requires that the fault tolerant clocks (FTCs) which are part of each operable network element are time-synchronized so that all of the clock pulses thereof are in phase. Further the network elements are data synchronized so as to assure that packets of data are broadcast from all wafers at the same time, a suitable data synchronization routine being used for such purpose to test the synchronized data operations among operating processors of different wafers. Once the wafers have been synchronized to operate in time and data synchronization, suitable configuration routines can be used so that one or more redundant groups of processors can be configured, each redundant group containing processors which are on different wafers. For a triplex redundant group, for example, one out of three processing elements is from a wafer under test and two out of three processing elements are from other wafers which have already been previously tested. The testing components and data paths on each wafer, the synchronization of wafer operations, and the configuration of redundant groups of processors are discussed in more detail below.

As discussed above intial testing requires that each processor on each wafer be self-tested. Self-testing of a processor is an operation which would be well within the skill of the art, and for any particular processor architecture, self-testing routines can be readily devised for such purpose. It is understood that each processor element 11 includes its own processor memory and such self-testing routines can be pre-stored in each processor's memory, which routines are automatically called up at start up, i.e., at a power "on" condition. Each processor can automatically perform whatever self-test routine has been so developed for that processor.

Once the processors themselves have been tested, testing of the data paths and the components of each network element on each wafer is required. Such testing can be accomplished once at least one working processor element on a wafer has been self-tested and is determined to be functional. A control circuit 13 and a dual port memory 14 on network element 12 of a wafer are powered up and cleared so that they can be ready to accept commands from a selected working processor element for testing the remaining network element components and data paths. When the control circuit and dual port memory have been cleared for operation, a selected working processor sets a location in the dual port memory to identify the processor being used and the processor calls from its memory one or more network element testing routines which have been pre-stored therein for such purpose. Such routines contain appropriate commands issued from the processor to the control circuit of the network element in order to test different portions of the network element configuration, e.g. commands for testing selected data paths (busses) and those components in the particular data paths involved. A variety of different data path testing routines can be devised by those in the art so that, when all of the network element testing routines have been completed, the operations of all of the components and interconnections among them are suitably tested and the operable and non-operable components and data path interconnections appropriately identified.

While the development of appropriate testing routines for such purpose would be within the skill of the art it is helpful in understanding the invention to describe two exemplary testing routines, it being understood that such routines are exemplary only and that many others can also be devised by those in the art for such purpose. One such routine may be used, for example, to test the functionality of the input FIFO registers 15 and output FIFO registers 16 of a network element. For example, the dual port memory 14 is supplied with known data from the processor and a command is supplied from the processor to the control circuit requiring the control circuit to supply such known data from memory 14 via bus 17 to each output FIFO 16 and, thence, from each output FIFO 16 to a corresponding input FIFO 15 via buses 18 and 19. The data supplied from each input FIFO 15 is then compared by the control circuit with the originally supplied data to the corresponding output FIFO to see if the final data and such original data are the same. Discrepancies or errors are appropriately noted so that a faulty FIFO component or a faulty bus inteconnection can be identified. Where no errors are found the data path and FIFO components involved can be identified as operable.

In another examplary test routine, a special multiplexer (MUX) 20, sometimes referred to as a "debug" MUX, can be used to provide known data supplied thereto by a working processor via an operable output FIFO 16, to a vote bank 21 of FIFO registers. The processor supplies such known data to memory 14 together with a suitable command to the control unit which control unit then supplies such data through a selected output FIFO 16 to the debug MUX 20, the control unit setting the MUX unit so that such data is routed to a specifically selected vote bank 21 of FIFOs.

The outputs of the vote bank FIFOs are supplied to a voter circuit 22 having a suitable mask 22A of the network element, for example. If, for example, identical known data is supplied to three of the vote bank FIFOs and different data is supplied to the remaining FIFO thereof, the outputs of the voter circuit can be suitably analyzed by the control processor to determine which such components are operating correctly. By supplying identical data to various combinations of the vote bank FIFOs and different data to a remaining one thereof, the processor can appropriately process the voted output to find which, if any, of the vote bank FIFOs is faulty or if the voter circuit itself is functioning correctly.

Other appropriate routines can be devised by those in the art to test various other combinations of data paths and components until all the data paths and components therein have been tested and the operable and non-operable ones suitably identified. A network element may, if desired, have redundant components formed thereon so that alternate components are available if a component is identified as faulty. For example, a second voter circuit 23 (shown in phantom) may be formed as part of the network element, additional vote bank FIFOs (not shown) can also be formed, another control circuit (not shown) can be formed, etc., and each may be suitably tested using appropriately devised routines as discussed above.

The testing of the processors and the network elements of each wafer thereby suitably identifies all the operable components and data paths thereon. It is required also that the fault-tolerant clocks of all the correctly functioning network elements operate in time synchronism and further that data transfer synchronization be tested so that the desired synchronized intercommunication among wafers can be instituted.

Synchronization techniques for use in fault tolerant systems, wherein fault tolerant clocks, such as fault tolerant clock 26 in FIG. 2, operate in each of a plurality of different network elements, would be well known and within the skill of those in the art. Various exemplary techniques for synchronization have been described, for example, in U.S. Pat. No. 4,239,982 issued to Smith et al. on Dec. 16, 1980, U.S. Pat. No. 4,600,845 issued to McKenna on Jul. 15, 1986, and U.S. Pat. No. 4,937,741 issued to Harper et al. on Jun. 26, 1990. Use of synchronization techniques provides time synchronization of all of the fault tolerant clocks of all of the network elements of the wafer cluster, i.e., the clock pulses of all of the FTCs in all of the network elements are in phase.

Once the FTCs are in time synchronism further synchronization of the data transfer among the wafers can also be implemented. For such purposes a data transfer synchronization routine can be prestored and supplied by a processor for use by the control circuit of each network element on each wafer. An examplary data synchronization routine can be explained with the help of the drawing shown in FIG. 3.

Figure 3:
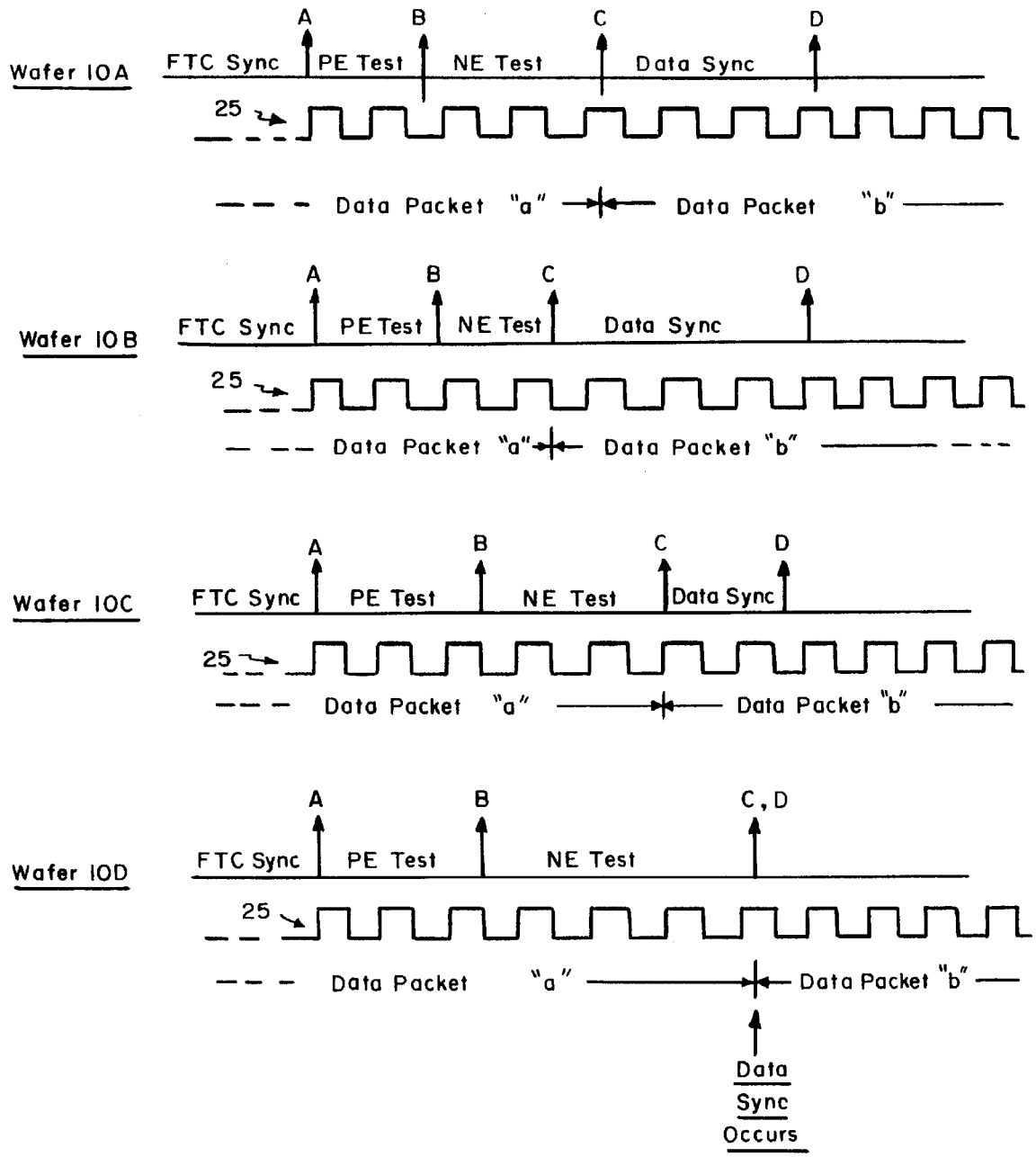
FIG. 3 shows waveforms relating to an exemplary data synchronization routine as used in the invention.

As seen therein, FTC time synchronization routine can be initially performed (e.g., at initial power on condition), prior to (or, alternatively, simultaneously with) the self-testing of each of the processors, as shown. Once FTC time synchronization is achieved, the clock pulses 25 of each FTC in each network element are in place as shown. In the example depicted, four wafers 10A–10D of a cluster thereof are utilized, each having a network element with a fault tolerant clock (FTC). The clock pulses of the FTC of each wafer's network element are time synchronized by point A. Between point A and point B, for each wafer, self-testing of each of the processors (PE Test) on each wafer can be completed, while between point B and point C, for each wafer, testing of the network element components and data paths on such wafer (NE Test) can be completed. As can be seen in FIG. 3, such latter testing is normally completed at different times for different wafers, i.e. points B and C will not necessarily occur at the same time for each wafer.

Once a wafer has completed its network element test routines, a data synchronization operation can be started, it being desired that in accordance with such operation all of the wafers be synchronized so as to broadcast the same known packet of data in a synchronized fashion. In order to assure that all wafers are ready to begin data transfer operations in synchronization, when a first particular wafer has completed its network element testing (i.e. at point C) it is arranged so as to broadcast a specific and identifiable packet of data (shown as data packet "b"), such data packet being contrasted with unspecified and unidentifiable data which has been broadcast prior to that time (shown as data packet "a"). The known data packet b is broadcast, from a wafer which has completed its internal testing, to all other wafers when time C is reached for each wafer. Wafers which have not completed all of their testing routines do not supply such known and identifiable data packet b.

In the specific example shown, it is assumed that Wafer 10B has completed its processor and network element testing at point C and thereupon is the first to broadcast the specified packet b. None of the other wafers at that point: have completed their own testing procedures and, accordingly, will not broadcast such known data packet b, but will, in effect, continue to broadcast an unspecified data packet a. The vote of a voter circuit in each wafer which receives data from all other wafers will indicate that only one wafer has broadcast data packet b and that all other wafers have not reached the point where data packet b is being broadcast.

Wafer 10A next completes its testing at its point C and begins to broadcast the same specified and identifiable packet b to all other wafers. At that stage the vote of the voter circuits of all the wafers again will show that not all wafers are broadcasting data packet b. As each wafer finishes its testing routines at point C and begins to broadcast data packet b, the voted output changes until it recognizes the condition at which the final wafer (Wafer 10D in the example shown) has completed its testing routines and is the last wafer to broadcast data packet b. At that time the voter circuits of each wafer will show that data packet b is then being broadcast by all wafers and that data synchronization for all wafers has occurred. Each of the wafers can thereupon be used so as to transfer and receive data to and from each other wafer in synchronization. Once this stage occurs, suitable redundant processor groups can be configured, as discussed below.

In order to understand the technique for configuring a redundant group of processors, an example is discussed below of the configuring of a triplex redundant group thereof from three simplex processing elements, which have been tested as fully operating processors, each such processor residing in a different fault containment region of a cluster thereof.

FIGS. 4A through 4E show programming flow charts which depict more specifically a procedure for forming a redundant group, in this case an exemplary triplex group. A specific implementation of such flow charts would be well within the skill of those in the art and need not be described in more detail.

Figures 4A, 4B:
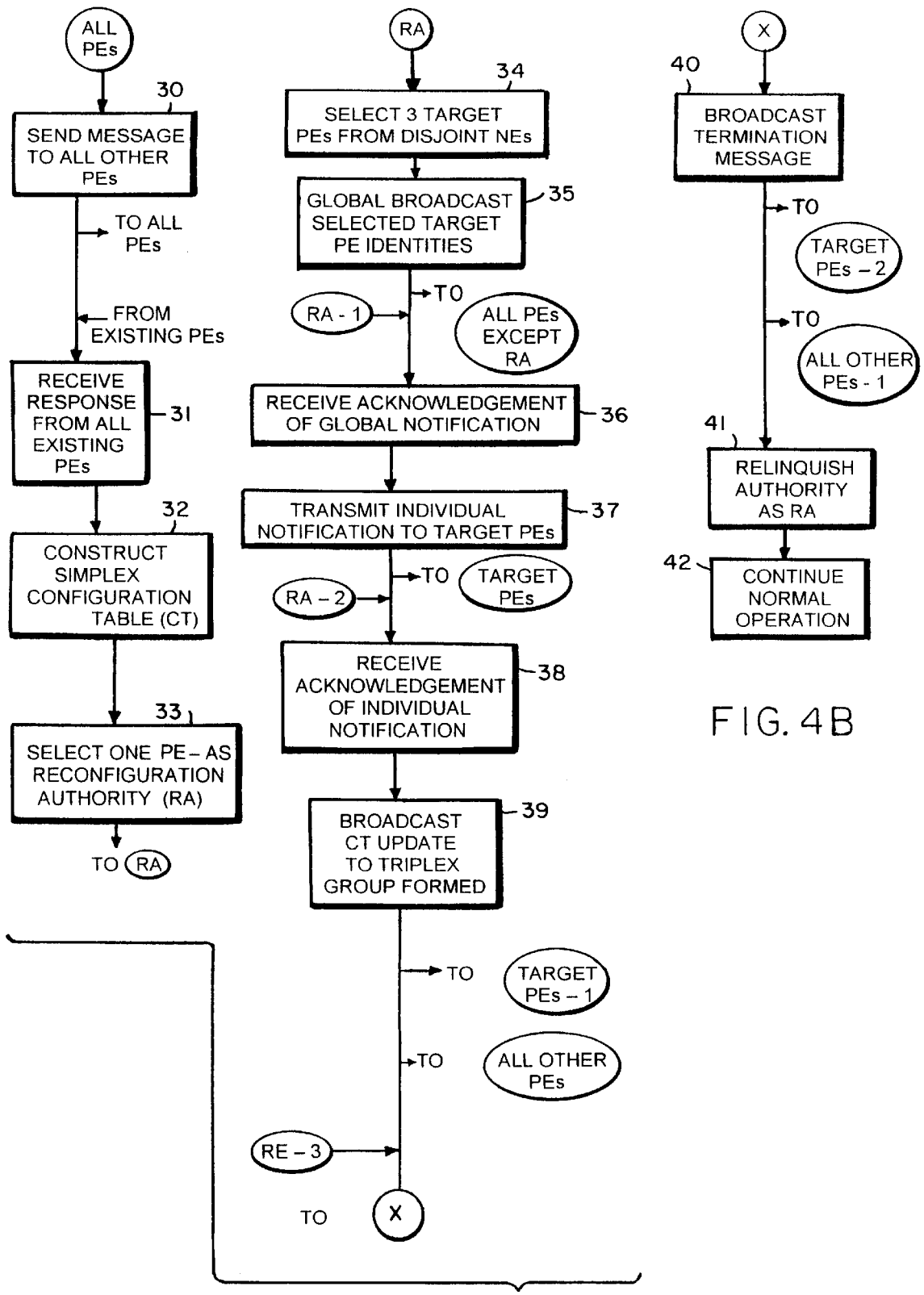
FIGS. 4A, 4B, 4C, 4D, and 4E shows flow charts designating an exemplary procedure for forming a redundant group of processing elements.

As can be seen in FIG. 4A, all of the functioning processing elements (PEs) which can be used in forming a desired triplex redundant group are identified, i.e., a mutual consensus regarding the identity of all such PEs is arrived at. For such purpose, each functioning PE in the cluster sends a message to each other functioning PE to identify which PEs are operational and available as functional PEs. Each functioning PE responds to the messages from all other functioning PEs (block 30) by broadcasting an identifying response message to all other PEs so that each PE then has information concerning the identity of all known functioning PEs in the cluster (block 31).

Based on such identifications, each PE constructs in its memory a Configuration Table (CT) (block 32) the entries in which identify each existing and functioning PE as a "simplex group", i.e., a group consisting of only a single processor element. One of the functioning PEs is then selected as a Reconfiguration Authority (RA) (block 33), the function of which is to control the configuration of the desired triplex redundant group. The process of selecting a PE to act as an RA can be performed in accordance with any one of a number of arbitrarily designated procedures any one of which can be readily devised within the skill of those in the art and is in a sense arbitrary so long as a single functioning PE from a tested wafer is selected as the RA, which PE can be from any one of the fault containment regions of the cluster.

Once a functioning PE is selected as an RA, that PE selects, from its Configuration Table, which identifies all functioning PEs, three PEs which reside in separate fault containment regions (block 30), and one of these is in the wafer under test, i.e., each of the three selected PEs is connected to the rest of the cluster through a different Network Element (NE). The three selected PEs will then be used to form the desired triplex group (one of the selected PEs may even be the RA itself, although it need not be), as seen in FIG. 4B. The selection process can be made in accordance with any number of procedures and the techniques for doing so would be well within the skill of those in the art.

Figures 4C, 4D, 4E:
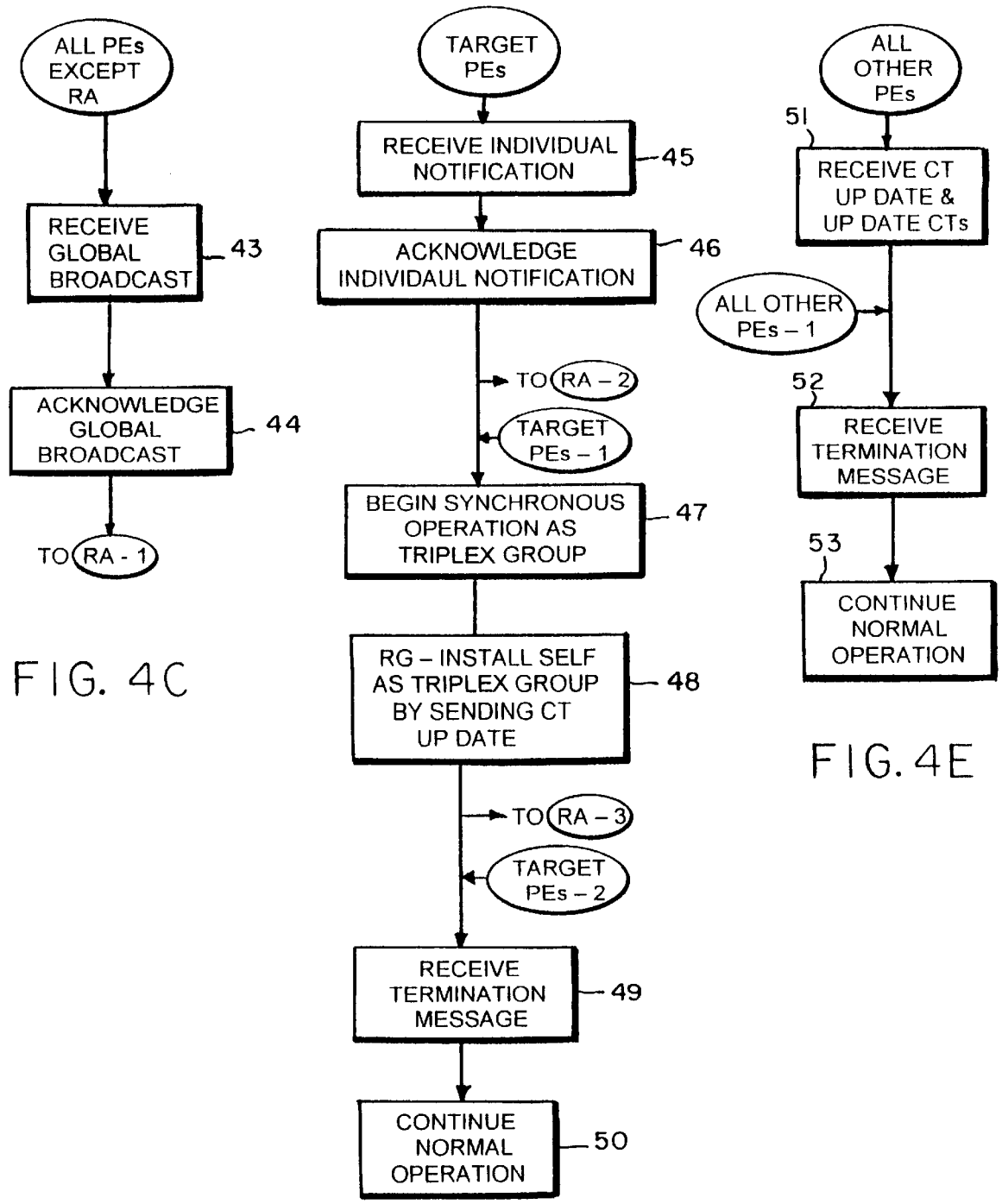

Once having selected the three PEs, the RA broadcasts a Global Notification (GN) message identifying the three selected PEs to all functioning PEs in the cluster other than itself (block 35). Such notification is received by all functioning PEs and each receiving PE transmits an acknowledgement of the receipt of such GN information to the RA, as seen in FIG. 4C (blocks 43, 44). Such transmittal indicates that each PE will transmit no further messages to the three selected PEs which are to form the desired triplex group until the reconfiguration process is completed. Such restriction is necessary to prevent messages from being misrouted while the triplex group is being reconfigured, i.e., during the period when the configuration tables of each PE have not been brought into final consistency.

When acknowledgements have been received by the RA from each functioning simplex PE of the cluster (block 36), the RA transmits an Individual Notification (IN) message to the three specifically identified PEs which have been selected (block 37) to form the desired triplex group (FIG. 4D). The purpose of such IN message is to allow each of the three selected PEs to complete any outstanding processing tasks in which it may be involved so that it can subsequently be prepared to become a member of the desired triplex group. When each selected PE has completed any outstanding task and is ready for reconfiguration, it transmits an acknowledgement of the IN message to the RA (FIG. 4D) (blocks 45, 46) and awaits a Configuration Table update message informing it that it has become a member of the triplex group.

When the RA receives the IN acknowledgements (block 38) from all three selected PEs (FIG. 4A), the RA broadcasts globally to all PEs of the cluster a single update message which informs all of the PEs of the overall cluster of the identities of the selected PEs and the fact that they are now formed as a specified triplex group (block 39).

When the three selected PEs receive the update message, they begin synchronous execution (block 47) at a common initialization point and become a functioning triplex group. A procedure for beginning such synchronous execution can be appropriately devised and would be well within the skill of the art. The triplex group thereupon once again transmits a global update message signifying that it has now been installed as the desired triplex group (block 48).

The transmittal of such update message by each processing element associated with the triplex group causes each NE to be unresponsive to any Configuration Table update messages emanating from other redundant groups having a redundancy level lower than a triplex level. Accordingly, after initialization the cluster becomes fault tolerant because simplex groups can no longer change the system's configuration with respect to such triplex group. When other processing elements receive the update message, they each update their own configuration Tables and are then permitted to send messages to such newly formed triplex group (block 51).

If other redundant processing groups are to be configured, substantially the same process can be performed, except that the three processing elements already selected for the above triplex group cannot be selected for other subsequent redundant groups. If no other redundant configuration is to be formed the reconfiguration authority relinquishes its authority and broadcasts a suitable global termination message signal signifying that it has done so and normal processing operations can be begun by all of the PEs in the cluster (FIG. 4B-blocks 40, 41, 42; FIG. 4D-blocks 49, 50; and FIG. 4E-blocks 53, 52).

Testing of processing elements (PEs) whose operability is not known can be done by using a redundant group of which the operability of all but one member is known and the unknown processing element is used as the final member, e.g., in a triplex group two known elements are used and one unknown element. While the discussion which follows deals with testing of processing elements the process involved can also be used to test network elements. The triplex group can then be used to execute one or more operating system programs and the outputs resulting from the execution of such programs from the three members of the group can be compared. If all the outputs of the PEs of the group being tested by the use of such operating system programs agree, such group can be used to test other PEs. Thus, the procedure using one or more operating system programs can be repeated with two of the PEs originally tested and a third PE which is on the wafer under test. The operating system program used for testing can be any well-known program known to the tester and techniques for running such a program by each processing element being used for the test and comparing the outputs thereof would also be well-known to those in the art. If the output of the PE under test does not agree with the outputs of the processing elements which were previously tested as operable, the processing element under test is disabled. A different processing element can then be tested with the two known and tested processing elements using the same procedure. In this way, so long as two processing elements have undergone such tests and have been found to be operable, they can be used to test any number of other processing elements in the same way.

If, in the extremely rare case of such testing, a processing element, previously tested as operable, fails during the test itself, the above procedure will not be able to determine whether the failure of the outputs to agree in that instance is because the "unknown" processing element under test is non-operable or because a "known" and previously tested processing element has failed during the test, or both. To assure that testing in such a situation is accurate, more than three redundant processing elements must be used. The number of processing elements used (each of which must reside on a separate wafer) can be selected in accordance with the principles set forth in U.S. Pat. No. 4,907,232 issued to Harper et al. on Mar. 6, 1990. For example, for such type of failure e.g., where two processing elements may fail simultaneously, seven processing elements are used, in this case, six previously tested operable processing elements together with an unknown processing element. This principle can be expanded more generally as indicated in the aforesaid co-pending application, as requiring the use of (3f+1) redundant processing elements for determining multiple f failures, e.g., where the possibility of two errors exist in the situation described above (f=2), seven redundant processing elements must be used to assure that such two processor fault conditions can be determined unambiguously and the faulty processors identified.

In initially starting the above test procedure using a first selected number of known and operable processors in order to test a single processor whose operability is not known, it is necessary initially to find a sufficient number of processors for which there exists a high degree of assurance of their operabilities, e.g., if a triplex group is to be used in the testing process, there must be a high degree of assurance that two of the processors of the triplex group are operable.

Initially, processors which have been self-tested as being operable can be selected to form a first triplex group, even though such self-tests do not necessarily assure that each processor will operate correctly in an operating system environment, i.e., one where its operation must be synchronized with that of other processors so as to be able to execute one or more exemplary operating system programs correctly. Once such self-tested processors are initially selected, the above techniques for synchronizing their operations can be used. If they cannot be synchronized, one or more other self-tested processors can be substituted for one or more of the initially selected processors until three processors are found to operate synchronously.

Once such synchronous operation is achieved, the synchronized processors are used to execute one or more operating system programs and their outputs compared. If all three outputs for all programs executed agree, then there is the required high degree of assurance that the three processors of the group are all operable and, in a triplex environment, any two of them can be selected to test successively, for example, the operability of a plurality of third unknown processors, as discussed above. If only two of the outputs agree, those two processors can be selected as the operable processor for use in testing the unknown processors. If no outputs agree, other self-tested processors can be selected and the programs executed again until the outputs of at least two processors are found to agree when executing one or more operating system programs. Such "bootstrapping" operation then permits two operable processors to be used in a triplex group so that any number of unknown processors can be inserted as the third member of the group and tested for operability so that a high degree of assurance can be achieved in evaluating each unknown processor's operability.

As mentioned above, the same technique can be used to test network elements of a wafer and, once the processing elements and network elements of a wafer have been so tested, the methodology which has been used assures that the desired testing of a wafer has been achieved.

What is claimed is:

1. Wafer scale integrated circuitry comprising:

a plurality of wafers forming a cluster thereof, each wafer comprising a plurality of operating means including a plurality of processing means for processing information; and a network means connected to said plurality of processing means for controlling the transfer of information to and from said processing means, said network means being further connected via communication paths to the network means of each of the other ones of said plurality of wafers for controlling the transfer of information to and from network means of said other wafers;

one or more redundant groups of processing means being formed on said wafers of said cluster, each redundant group being arranged so that the processing means thereof reside on different ones of said wafers;

each of said processing means including means for self-testing the processing means to identify whether said processing means is operable or non-operable, each of the operable processing means of the cluster being available for operation as a single processing means or for operation as a member of a redundant group of said one or more redundant groups of processing means;

each of said network means including control means for testing information transfer paths in each of said network means which permit the transfer of information to and from the processing means connected thereto in order to determine which of said information transfer paths are operable or non-operable and for testing further information transfer paths in said network means which would permit the transfer of information to and from the communication paths to the network means of said other wafers in order to determine which of said further information transfer paths are operable or non-operable;

specified ones of said operable processing means being included in said one or more redundant groups, said circuitry further including means for identifying said specified ones of said operable processing elements to all of the operating processing means in said cluster;

each of the operable processing means in the cluster having means for storing identifications of the specified operable processing means of the cluster which are included in said one or more redundant groups and for identifying remaining unspecified ones of said operable processing means as single processing means.

2. Wafer scale integration circuitry in accordance with claim 1 wherein the control means of each of said network means includes means for synchronizing the transfer of data among said wafers after said processing means and said network means are tested for operability and before said one or more redundant groups of operable processing means are formed.

3. Wafer scale integration circuitry in accordance with claim 1 wherein said storing means comprises a processing means configuration table having a plurality of entries, each entry corresponding to one of the processing means of said cluster for identifying the operability of said processing means and a redundancy status thereof.

4. Wafer scale integrated circuitry comprising:

a plurality of wafers forming a cluster thereof, each wafer comprising a plurality of operating means including a plurality of processing means for processing information; and a network means connected to said plurality of processing means for controlling the transfer of information to and from said processing means, said network means being further connected via communication paths to the network means of each of the other ones of said plurality of wafers for controlling the transfer of information to and from network means of said other wafers;

one or more redundant groups of processing means being formed on said wafers of said cluster, each redundant group being arranged so that the processing means thereof reside on different ones of said wafers;

means for testing the operability of operating means in said wafers, said testing means including:

means for synchronizing the operation of the operating means of one of said redundant groups of operating means and executing one or more selected operating system programs;

means for comparing the outputs of said one or more executed programs from each of said operating means to determine which of said outputs agree;

means for forming a testing redundant group comprising the operating means whose said outputs agree and a single operating means of another of said redundant groups whose operability is not known;

means for synchronizing the operation of the operating means of said testing redundant group and executing one or more operating system programs; and means for comparing the outputs of said one or more executed programs from each of the operating means of said testing redundant group to determine if the output of the single operating means agrees with the outputs of said operating means whose outputs agree.

5. Wafer scale integration circuitry in accordance with claim 4 wherein said testing redundant group is used to determine the operability of a plurality of operating means whose operability is unknown.

6. Wafer scale integration circuitry in accordance with claim 4 wherein said testing redundant group is a triplex group comprising two operating means whose outputs agree and a third operating means whose operability is unknown.

7. Wafer scale integration circuitry in accordance with claim 4 for detetecting up to f operating failures wherein said testing redundant group comprises (3f+1) operating means, 3f operating means of which are processing means the outputs of which agree and one processing means which is a processing means whose operability is unknown.

8. Wafer scale integration circuitry in accordance with claims 4, 5, 6 or 7 wherein said operating means are processing means.

9. Wafer scale integration circuitry in accordance with claims 4, 5, 6 or 7 wherein said operating means are network means.

* * * * *